United States Patent
Koike

(10) Patent No.: US 11,212,905 B2
(45) Date of Patent: Dec. 28, 2021

(54) FIELD DEVICE CAPABLE OF OPERATING IN EXTREMELY LOW-TEMPERATURE ENVIRONMENT

(71) Applicant: YOKOGAWA ELECTRIC CORPORATION, Musashino (JP)

(72) Inventor: Yasumi Koike, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 85 days.

(21) Appl. No.: 16/696,362

(22) Filed: Nov. 26, 2019

(65) Prior Publication Data

US 2020/0178382 A1 Jun. 4, 2020

(30) Foreign Application Priority Data

Nov. 30, 2018 (JP) .............................. JP2018-225187

(51) Int. Cl.
*H05K 1/02* (2006.01)
*H05K 7/20* (2006.01)
(Continued)

(52) U.S. Cl.
CPC ......... *H05K 1/0201* (2013.01); *H05B 1/0213* (2013.01); *H05K 1/181* (2013.01);
(Continued)

(58) Field of Classification Search
CPC ....... H05K 1/0293; H05K 2201/10181; H05K 2203/175; H05K 2203/176; H05K 1/18; H05K 1/181; H05K 2201/0305; H05K 2201/09036; H05K 2201/09063; H05K 2201/09072; H05K 2201/10053; H05K 2201/10909; H05K 2201/2081; H05K 2203/0415; H05K 2203/304; H05K 3/284; H05K 3/3421; H05K 3/3489; H05K 5/064; H05K 7/20
(Continued)

(56) References Cited

U.S. PATENT DOCUMENTS 4,496,928 A * 1/1985 Hollweck ................. F24C 7/08
337/333
5,854,584 A * 12/1998 Rogelein ................ H01H 81/02
337/333
(Continued)

FOREIGN PATENT DOCUMENTS

CN 202916947 U * 5/2013
JP 2002-33134 A 1/2002
(Continued)

*Primary Examiner* — Andre J Allen
(74) *Attorney, Agent, or Firm* — Westerman, Hattori, Daniels & Adrian, LLP

(57) ABSTRACT

A field device (1) includes an electronic circuit (200) connected to at least one of a sensor (600) and an actuator, a bimetal temperature switch (400) connected to a power source (100) in series with the electronic circuit (200) and configured to turn on when rising to a first temperature, a heating element (500) connectable to the power source (100) in parallel with the electronic circuit (200) and the temperature switch (400), and a housing (300) configured to house the electronic circuit (200), the temperature switch (400), and the heating element (500).

5 Claims, 6 Drawing Sheets

(51) Int. Cl.
*H05K 5/06* (2006.01)
*H05K 1/18* (2006.01)
*H05B 1/02* (2006.01)

(52) U.S. Cl.
CPC ............... *H05K 5/064* (2013.01); *H05K 7/20* (2013.01); *H05K 2201/10053* (2013.01)

(58) Field of Classification Search
USPC ...................................................... 337/1–417
See application file for complete search history.

(56) References Cited

U.S. PATENT DOCUMENTS

| | | | | |
|---|---|---|---|---|
| 6,670,587 | B1* | 12/2003 | DiSalvo | H01H 37/004 |
| | | | | 174/535 |
| 2002/0011915 | A1* | 1/2002 | Niino | H01H 37/5436 |
| | | | | 337/53 |
| 2010/0245021 | A1* | 9/2010 | Furuhata | H01H 83/223 |
| | | | | 337/112 |
| 2010/0314381 | A1* | 12/2010 | Wang | H05B 3/36 |
| | | | | 219/494 |
| 2015/0022311 | A1* | 1/2015 | Oohira | H01H 37/34 |
| | | | | 337/299 |
| 2015/0221466 | A1* | 8/2015 | Suzuki | H05B 1/0213 |
| | | | | 219/512 |
| 2017/0082071 | A1* | 3/2017 | Ham | F02M 31/16 |
| 2019/0237833 | A1* | 8/2019 | Kulp | H01M 10/6567 |

FOREIGN PATENT DOCUMENTS

| | | |
|---|---|---|
| JP | 2002-108460 A | 4/2002 |
| JP | 2012-506089 A | 3/2012 |
| JP | 2017-076487 A | 4/2017 |
| WO | 2010/044887 A1 | 4/2010 |

\* cited by examiner

FIELD DEVICE CAPABLE OF OPERATING IN EXTREMELY LOW-TEMPERATURE ENVIRONMENT

CROSS-REFERENCE TO RELATED APPLICATION

The present application claims priority to and the benefit of Japanese Patent Application No. 2018-225187 filed Nov. 30, 2018, the entire contents of which are incorporated herein by reference.

TECHNICAL FIELD

The present disclosure relates to a field device.

BACKGROUND

Field devices and the like used in locations such as plants may be used in harsh environments, depending on where they are installed. For example, a field device might be used in an extremely low-temperature environment. When used in such an extremely low-temperature environment, the field device may be affected by the environment, making operations unstable.

A known field device addresses this issue by including electronic components that operate normally even when used in an extremely low-temperature environment. For example, patent literature (PTL) 1 discloses a field device with a temperature control function to control the internal temperature by using a sensor to detect the internal temperature of the field device and using a controller to adjust the heat provided to the field device.

CITATION LIST

Patent Literature

PTL 1: JP2012-506089A

SUMMARY

A field device according to an embodiment includes an electronic circuit connected to at least one of a sensor and an actuator, a bimetal temperature switch connected to a power source in series with the electronic circuit and configured to turn on when rising to a first temperature, a heating element connectable to the power source in parallel with the electronic circuit and the temperature switch, and a housing configured to house the electronic circuit, the temperature switch, and the heating element.

DETAILED DESCRIPTION

The field device disclosed in PTL 1 has a complex configuration and is hard to reduce in size and cost.

It would be helpful to provide a field device that can operate stably even in an extremely low-temperature use environment and that allows a reduction in size and cost.

A field device according to an embodiment includes an electronic circuit connected to at least one of a sensor and an actuator, a bimetal temperature switch connected to a power source in series with the electronic circuit and configured to turn on when rising to a first temperature, a heating element connectable to the power source in parallel with the electronic circuit and the temperature switch, and a housing configured to house the electronic circuit, the temperature switch, and the heating element. In this configuration, the heating element generates heat when power is supplied. When the temperature rises to the first temperature, the first temperature switch turns on, power is supplied to the main unit, and the main unit starts to operate. The main unit can therefore start to operate after having risen to the first temperature.

In an embodiment, the temperature switch may be joined in a heat transferable manner to a circuit board forming the electronic circuit. Power is therefore supplied to the electronic circuit when the electronic circuit has risen to the first temperature or a temperature near the first temperature.

In an embodiment, the temperature switch may be adhered to the circuit board by resin potting. Power is therefore supplied to the electronic circuit when the electronic circuit has risen to the first temperature or a temperature near the first temperature.

In an embodiment, the field device may further include another bimetal temperature switch connected to the power source in series with the heating element and in parallel with the electronic circuit and the temperature switch and configured to turn off when rising to a second temperature that is higher than the first temperature. Heat generation by the heating element is therefore suspended when the temperature rises to the second temperature. Hence, the temperature can be prevented from rising excessively, which suppresses unnecessary power consumption.

In an embodiment, the field device may further include another heating element that is switchable with the heating element and has a different heat generation temperature gradient than the heating element. The degree to which the temperature rises can therefore be adjusted in accordance with the environmental temperature.

The present disclosure can provide a field device that can operate stably even in an extremely low-temperature use environment and that allows a reduction in size and cost.

Embodiments of the present disclosure are now described with reference to the drawings.

Figure 1:
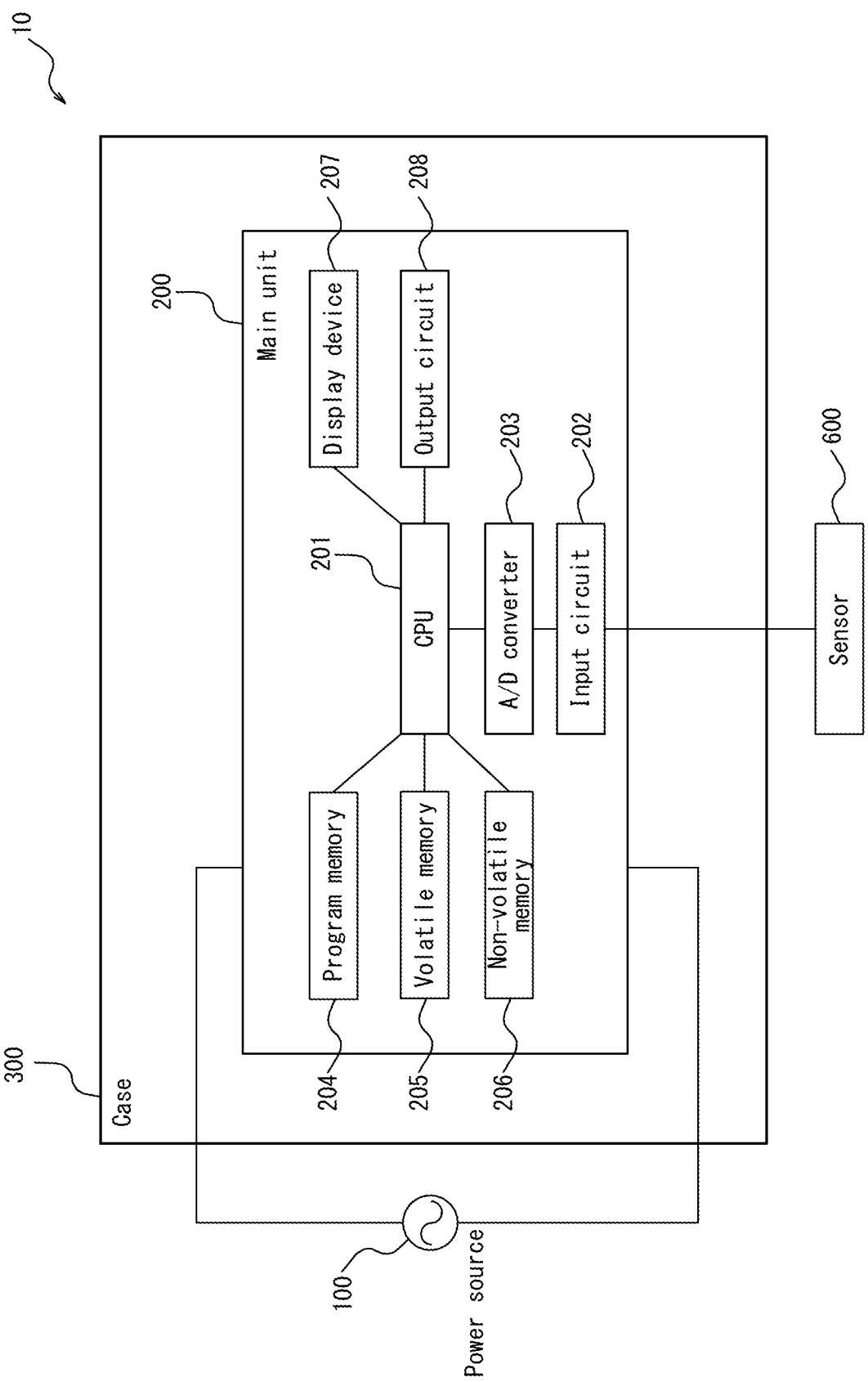
FIG. 1 is a functional block diagram illustrating the schematic configuration of a field device according to a comparative example.

First, a field device according to a comparative example is described. FIG. 1 is a functional block diagram illustrating the schematic configuration of a field device according to a comparative example. A field device 10 according to the comparative example includes a main unit (electronic circuit) 200 and a case (housing) 300 that houses the main unit 200.

The field device 10 is connected to a power source 100. Power is supplied to the main unit 200 from the power source 100.

The field device 10 is connected to a sensor 600. The sensor 600 measures various physical quantities and transmits the measurement results to the main unit 200 as a measurement signal. The sensor 600 may be configured as any sensor capable of measuring a desired physical quantity. The sensor 600 may, for example, include a pressure gauge, a flow gauge, a temperature sensor, or the like, but these examples are not limiting. Various other sensors may be included. The field device 10 may be connected to an actuator (not illustrated). For example, the field device 10 can be connected to a valve that includes an actuator and send the valve an electric or spatial signal related to the degree of opening of the valve, so as to control the valve to be open to a predetermined degree. The field device 10 may be connected to at least one of the sensor and the actuator. The sensor and the actuator may be installed either on the inside or the outside of the field device 10. In the present disclosure, the field device 10 is described below as being connected only to the sensor 600.

The case 300 protects the main unit 200 housed inside the case 300. The case 300 may, for example, be made of resin or metal. The case 300 may, however, be made of a material other than resin or metal.

The main unit 200 receives a measurement signal transmitted from the sensor 600, executes various calculations based on the received measurement signal, and performs operations such as outputting the measurement results to another device or displaying the measurement results. The main unit 200 includes a central processing unit (CPU) 201, an input circuit 202, an analog/digital (A/D) converter 203, a program memory 204, a volatile memory 205, a non-volatile memory 206, a display device 207, and an output circuit 208.

The CPU 201 controls and manages the main unit 200 overall, including the function blocks of the main unit 200. For example, the CPU 201 executes various processes by executing programs prescribing control procedures. Such programs may, for example, be stored in the program memory 204, on an external storage medium connected to the main unit 200, or the like.

The CPU 201 performs various calculations based on the measurement signal received from the sensor 600. The CPU 201 transmits a signal related to the calculation results to an external drive apparatus or controller via the output circuit 208, described below. The external drive apparatus or controller is a drive apparatus or controller installed in a plant. Examples of the plant include an industrial plant such as a chemical plant; a plant for managing a well site, such as a gas field or oil field, and the surrounding area; a plant for managing power generation such as hydroelectric power, thermal power, nuclear power, or the like; a plant for managing environmental power generation such as solar power, wind power, or the like; and a plant for managing water and sewage, a dam, or the like. The external drive apparatus may include valve devices such as flow control valves and opening/closing valves; actuators, such as fans or motors; acoustic devices, such as speakers; display devices such as displays; and the like. The drive apparatus performs control in accordance with received signals. For example, when the drive apparatus is a flow control valve, the drive apparatus can control the flow in accordance with the received signal. When the drive apparatus is an opening/closing valve, the drive apparatus can open and close the valve in accordance with the received signal. The external controller may perform proportional integral differential (PID) calculations or the like in accordance with the signal received from the CPU 201 and may control an external drive apparatus based on the calculation result.

The input circuit 202 is connected to a sensor 600. The input circuit 202 converts the level of the measurement signal transmitted from the sensor 600. In other words, the input circuit 202 converts a measurement signal to a level processable by the main unit 200. The measurement signal with the converted level is inputted into the A/D converter 203.

The A/D converter 203 converts the analog measurement signal inputted from the input circuit 202 to a digital signal.

The program memory 204 is a memory storing various programs. For example, the program memory 204 stores programs that cause the CPU 201 to operate. The program memory 204 may, for example, be configured by a flash memory (flash ROM) or the like.

The volatile memory 205 functions as a primary storage apparatus when a program is being executed by the CPU 201. The volatile memory 205 may, for example, be configured by random access memory (RAM).

The non-volatile memory 206 stores various information. The non-volatile memory 206 may be readable and writeable. The non-volatile memory 206 may, for example, store various parameters used in calculations. These parameters may, for example, be determined in advance by the user or manager of the field device 10. The non-volatile memory 206 may, for example, be configured by electrically erasable programmable read-only memory (EEPROM).

The display device 207 is an apparatus for displaying various information. The display device 207 is, for example, a well-known display such as a liquid crystal display (LCD), an organic electro-luminescence display (OELD), or an inorganic electro-luminescence display (IELD). The display device 207 displays the measurement results from the CPU 201, for example.

The output circuit 208 outputs the measurement results from the CPU 201 to an external drive apparatus or controller. The output circuit 208 outputs a signal corresponding to the measurement results from the CPU 201 with a current of 4 to 20 mA to the drive apparatus or controller, for example. The output circuit 208 may, for example, output a signal corresponding to the measurement results from the CPU 201 as a pulse signal.

As described above, the field device 10 performs operations such as receiving a measurement signal from the sensor 600, performing calculations, and transmitting a signal of the measurement results to an external drive apparatus or controller. Depending on the use environment of the field device 10, however, operations of the field device 10 may become unstable. For example, the electronic components of the field device 10 might not operate properly, or operations might become unstable, if the field device 10 is used in a cold area with extremely low temperatures, such as −60° C. or below. Operations of the field device 10 may therefore become unstable.

One way to address this issue is to stabilize operations of the field device 10 by configuring the field device 10 with special electronic components capable of stable operations even in an extremely low-temperature use environment. These special electronic components, however, have a higher unit price than normal components by virtue of being special. A field device 10 that is useable even at extremely low temperatures is therefore expensive overall. Special electronic components may also be large in size.

A field device capable of operating stably even in an extremely low-temperature use environment without requiring special components is therefore described in the present disclosure.

First Embodiment

Figure 2:
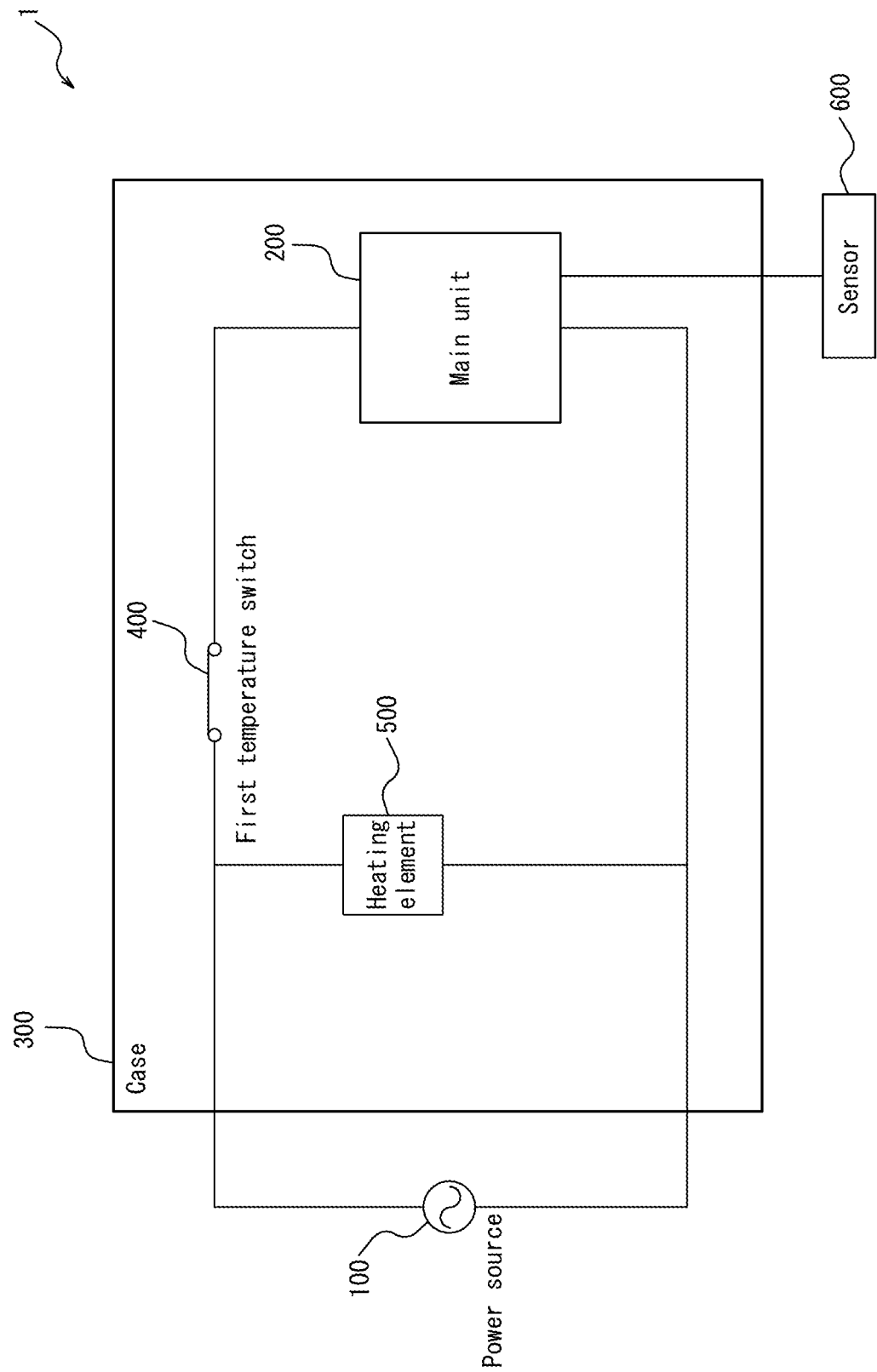
FIG. 2 is a functional block diagram illustrating the schematic configuration of a field device according to a first embodiment.

FIG. 2 is a functional block diagram illustrating the schematic configuration of a field device 1 according to a first embodiment. The field device 1 according to the first embodiment includes a main unit 200 and a case 300 housing the main unit 200. The configuration of the main unit 200 in the field device 1 is similar to that of the main unit 200 described in the comparative example. A depiction and description of the detailed functional blocks in the main unit 200 are therefore omitted here.

The field device 1 according to the present embodiment is connected to a sensor 600, like the field device 10 according to the comparative example. The field device 1 according to the present embodiment is also connected to a power source 100 and can receive a supply of power from the power source 100, like the field device 10 according to the comparative example.

The field device 1 according to the present embodiment includes a first temperature switch 400. The first temperature switch 400 is housed in the case 300. The first temperature switch 400 is a switch that switches between conducting (on) and not conducting (off) in accordance with the temperature. In the present embodiment, the first temperature switch 400 turns on by rising to the first temperature. The first temperature may be a temperature at which operations of the field device 1 are stable to a predetermined degree. The first temperature may be set appropriately in accordance with the specifications of the field device 1, the specifications of components of the electronic circuit, or the like. The first temperature switch 400 may, for example, be a bimetal thermoswitch.

As illustrated in FIG. 2, the first temperature switch 400 is connected to the power source 100 in series with the main unit 200. Accordingly, when the temperature is below the first temperature, the first temperature switch 400 turns off, and power is not supplied from the power source 100 to the main unit 200. Conversely, when the temperature rises to the first temperature, the first temperature switch 400 turns on, and power is supplied from the power source 100 to the main unit 200. In other words, power is supplied when the temperature is equal to or greater than the first temperature, and the main unit 200 becomes operable. The main unit 200 can therefore operate more stably than when operating at a lower temperature than the first temperature (such as an extremely low temperature).

The field device 1 according to the present embodiment further includes a heating element 500. The heating element 500 is housed in the case 300. The heating element 500 receives a supply of power and generates heat. The heating element 500 forms a heater, for example. The heating element 500 may, for example, be configured by a resistance element. The heating element 500 is connected to the power source 100 in parallel with the main unit 200 and the first temperature switch 400, as illustrated in FIG. 2. In other words, the heating element 500 is connected directly to the power source 100 without the first temperature switch 400 therebetween. Power is therefore supplied to the heating element 500 when the power source 100 is running, regardless of whether the first temperature switch 400 is on or off, and the heating element 500 then generates heat, raising the temperature inside the case 300.

In the field device 1 with the above-described configuration, power is supplied to the heating element 500 from the power source 100, and the heating element 500 generates heat. The temperature inside the case 300 rises as a result of the heat generated by the heating element 500. When the temperature inside the case 300 is lower than the first temperature, the first temperature switch 400 is off. In this case, power is not supplied to the main unit 200, and the main unit 200 does not operate. When the temperature inside the case 300 rises to the first temperature, the first temperature switch 400 turns on, power is supplied to the main unit 200, and the main unit 200 starts to operate. In this case, the main unit 200 can operate stably, because the temperature inside the case 300 is equal to or greater than the first temperature.

To achieve the desired stable operation of the main unit 200 in the present disclosure, it suffices for the first temperature switch 400 to be on when the temperature around the main unit 200 is equal to or greater than a first temperature threshold. From this perspective, the first temperature switch 400 is preferably disposed near the main unit 200. The first temperature switch 400 may, for example, be joined in a heat transferable manner to a circuit board forming the main unit 200. The first temperature switch 400 may, for example, be adhered by resin potting (including the case of being covered by resin) to the circuit board forming the main unit 200. Power is supplied to the main unit 200 by the first temperature switch 400 being on when the main unit 200 rises to the first temperature or a temperature near the first temperature.

Figure 3:
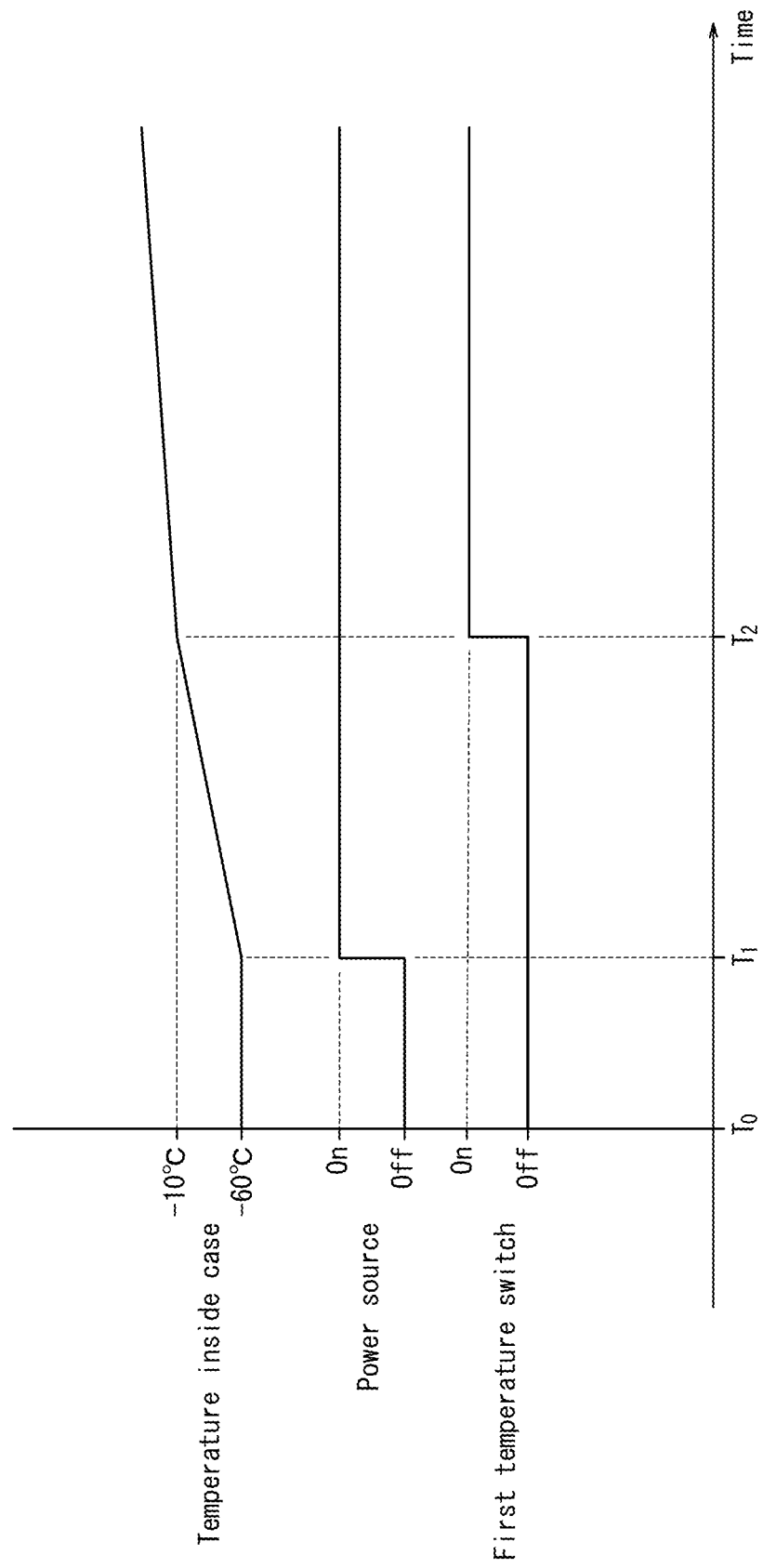
FIG. 3 illustrates operations by the field device of FIG. 2.

FIG. 3 illustrates operations by the field device 1. FIG. 3 illustrates the temperature change inside the case 300, the on or off state of the power source 100, and the on or off state of the first temperature switch 400. The horizontal axis in FIG. 3 represents the passage of time. The first temperature is −10° C. in the example in FIG. 3. In other words, in the example described here, the field device 1 can operate stably at or above −10° C.

The power source 100 is assumed to be off at time $T_0$. In other words, the power source 100 is not supplying power to the field device 1 at time $T_0$. The temperature inside the case 300 is assumed to be −60° C. at time $T_0$. In other words, the temperature inside the case 300 is lower than the first temperature of −10° C. The first temperature switch 400 is therefore off at time $T_0$.

At time $T_1$, an operation to turn the power source 100 on is inputted to the field device 1, for example by the operator, manager, or the like of the field device 1, as illustrated in FIG. 3. By the power source 100 being turned on, power is supplied to the heating element 500, and the heating element 500 generates heat. At this time, the first temperature switch 400 remains off, because the temperature inside the case 300 is lower than the first temperature of −10° C.

The temperature inside the case 300 rises as a result of the heat generated by the heating element 500. The temperature inside the case 300 reaches −10° C. at time $T_2$. When the temperature inside the case 300 reaches −10° C., the first temperature switch 400 turns on. Power then starts to be supplied to the main unit 200 from the power source 100, and the main unit 200 activates and starts operating. Since the temperature inside the case 300 is −10° C. or higher at this time, the main unit 200 can operate stably.

In this way, the field device 1 according to the present embodiment is configured so that when the temperature inside the case 300 rises to the first temperature, the first temperature switch 400 turns on, power is supplied to the main unit 200, and the main unit 200 starts to operate. The main unit 200 can therefore start to operate when the environment allows stable operations. Furthermore, by including the heating element 500, the field device 1 can raise the temperature inside the case 300 when the temperature inside the case 300 is lower than the first temperature, thereby quickly achieving an environment that allows the main unit 200 to operate stably. The field device 1 is thus capable of operating stably even in an extremely low-temperature use environment, without requiring special components.

Furthermore, by being configured with general-purpose components without use of special components, the field device 1 of the present embodiment can avoid the increase in costs that use of special components would entail. The field device 1 therefore allows a reduction in size and cost.

Second Embodiment

Figure 4:
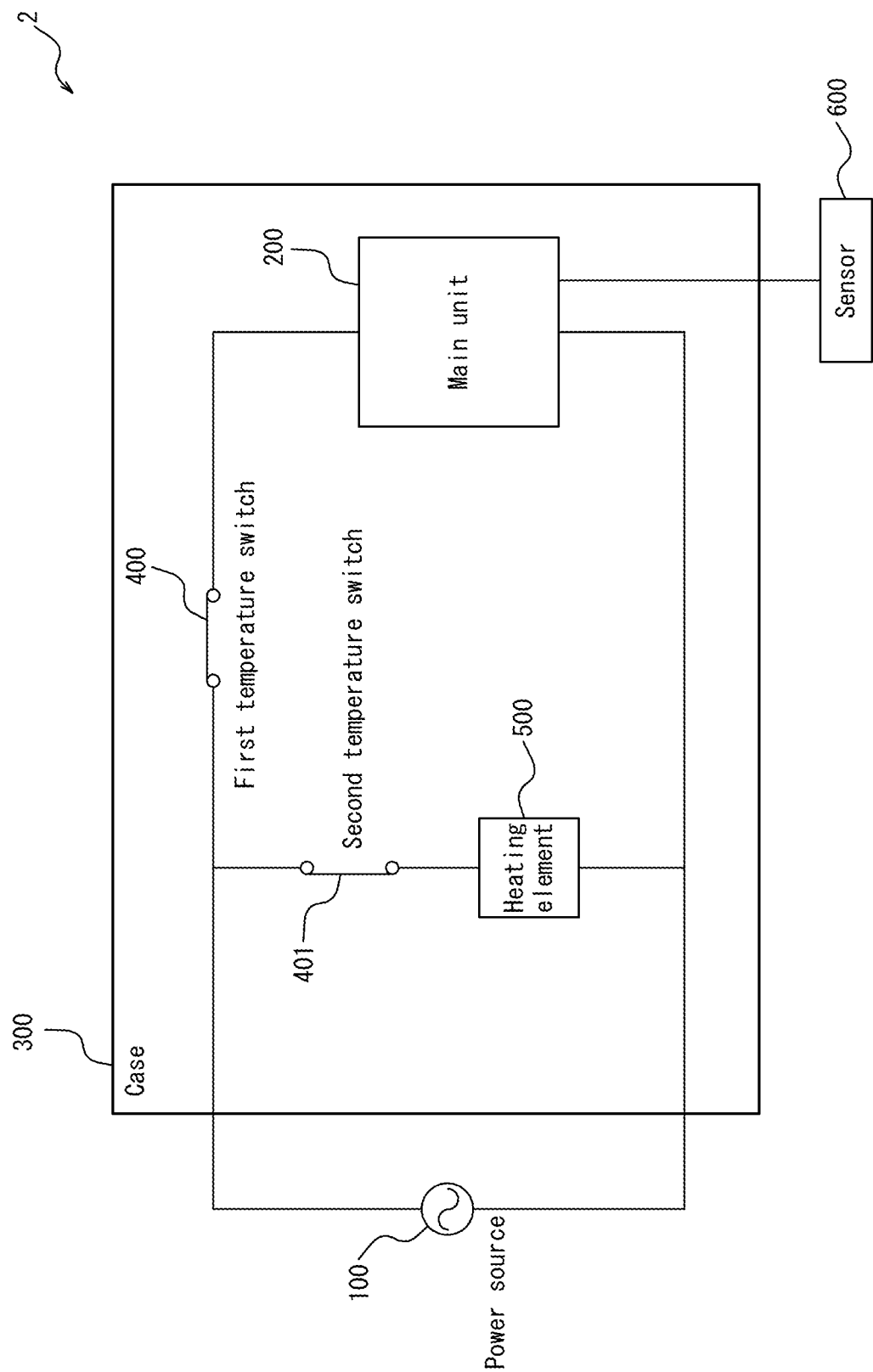
FIG. 4 is a functional block diagram illustrating the schematic configuration of a field device according to a second embodiment.

FIG. 4 is a functional block diagram illustrating the schematic configuration of a field device 2 according to a second embodiment. Like the field device 1 according to the first embodiment, the field device 2 according to the second embodiment includes a case 300, a main unit 200 housed inside the case 300, a first temperature switch 400, and a heating element 500. Differences between the field device 2 according to the second embodiment and the field device 1 according to the first embodiment are focused on below, with a description of points in common being omitted as appropriate.

The field device 2 according to the present embodiment further includes a second temperature switch 401. As illustrated in FIG. 4, the second temperature switch 401 is connected to the power source 100 in series with the heating element 500 and in parallel with the main unit 200 and the first temperature switch 400. The second temperature switch 401 is housed in the case 300. The second temperature switch 401 is a switch that switches between being on and off in accordance with the temperature. In the present embodiment, the second temperature switch 401 stops conducting, i.e. turns off, by rising to the second temperature. The second temperature is higher than the first temperature. The second temperature switch 401 may, for example, be a bimetal thermoswitch.

Figure 5:
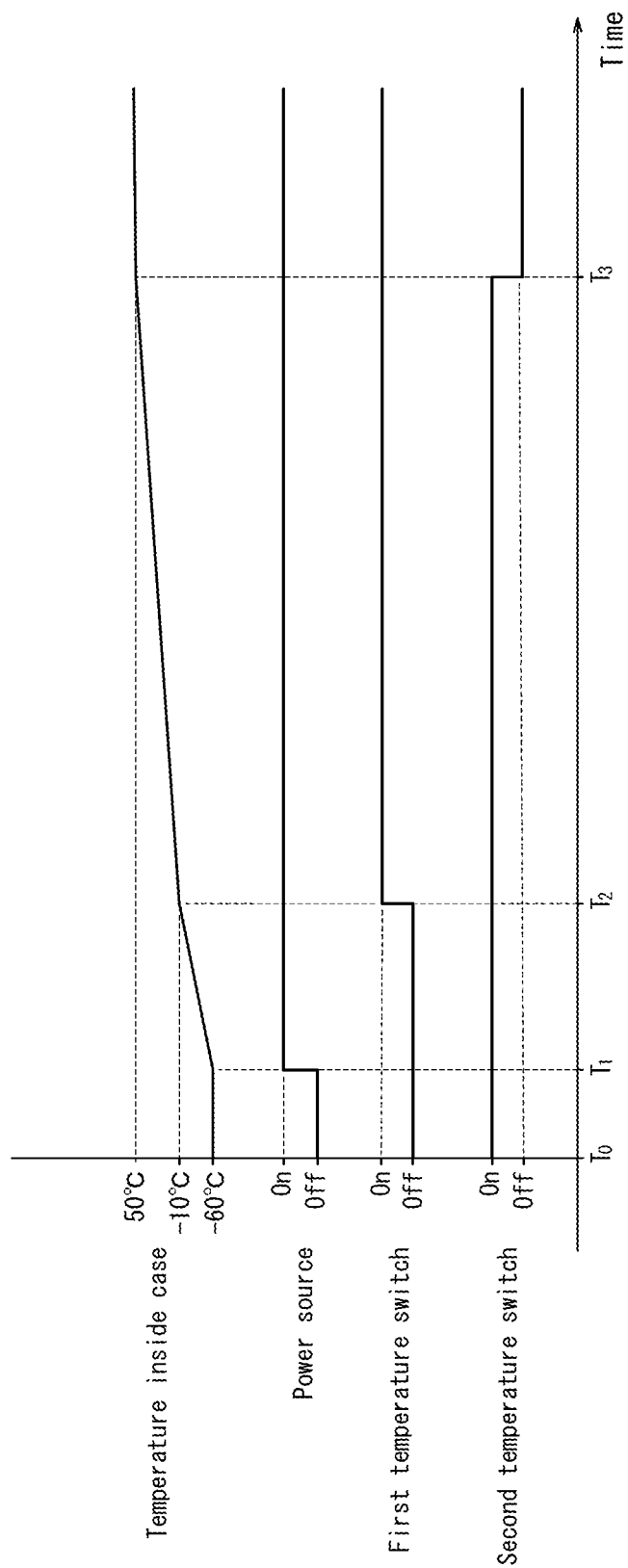
FIG. 5 illustrates operations by the field device of FIG. 4.

FIG. 5 illustrates operations by the field device 2. FIG. 5 illustrates the temperature change inside the case 300, the on or off state of the power source 100, the on or off state of the first temperature switch 400, and the on or off state of the second temperature switch 401. The horizontal axis in FIG. 5 represents the passage of time. The first temperature is −10° C. in the example in FIG. 5, like the example in FIG. 3. The second temperature is 50° C. in the example in FIG. 5.

The power source 100 is assumed to be off at time $T_0$. In other words, the power source 100 is not supplying power to the field device 2 at time $T_0$. The temperature inside the case 300 is assumed to be −60° C. at time $T_0$. In other words, the temperature inside the case 300 is lower than the first temperature of −10° C. At time $T_0$, the first temperature switch 400 is therefore off, and the second temperature switch 401 is on.

At time $T_1$, an operation to turn the power source 100 on is inputted to the field device 2, for example by the operator, manager, or the like of the field device 2, as illustrated in FIG. 5. At this time, the second temperature switch 401 is on, because the temperature inside the case 300 is lower than the second temperature of 50° C. Power is therefore supplied from the power source 100 to the heating element 500, and the heating element 500 generates heat. Conversely, the first temperature switch 400 remains off, because the temperature inside the case 300 is lower than the first temperature of −10° C.

The temperature inside the case 300 rises as a result of the heat generated by the heating element 500. The temperature inside the case 300 reaches −10° C. at time $T_2$. When the temperature inside the case 300 reaches −10° C., the first temperature switch 400 turns on. Power then starts to be supplied to the main unit 200 from the power source 100, and the main unit 200 activates and starts operating. Since the temperature inside the case 300 is −10° C. or higher at this time, the main unit 200 can operate stably. The second temperature switch 401 remains on, because the temperature inside the case 300 is lower than the second temperature of 50° C.

The temperature inside the case 300 rises further and reaches 50° C. at time $T_3$ as a result of the heat generated by the heating element 500. When the temperature inside the case 300 reaches 50° C., the second temperature switch 401 turns off. The supply of power to the heating element 500 then cuts off, suspending heat generation by the heating element 500. When the temperature inside the case 300 falls to 50° C. or lower, the second temperature switch 401 turns on again, and the temperature inside the case 300 rises due to heat generated by the heating element 500. The temperature inside the case 300 is therefore maintained in a range of −10° C. or higher, and the first temperature switch 400 remains on.

Like the field device 1 according to the first embodiment, the main unit 200 in the field device 2 according to the present embodiment can start to operate when the environment allows stable operations. Furthermore, the field device 2 according to the present embodiment includes the second temperature switch 401 that cuts off the supply of power to the heating element 500 when the temperature inside the case 300 reaches the second temperature or higher. The second temperature switch 401 thus suspends heat generation by the heating element 500 when the temperature inside the case 300 rises to the second temperature. Hence, the temperature inside the case 300 can be prevented from rising excessively, which suppresses unnecessary power consumption.

If, for example, the components used in the field device 2 operate unstably in an environment with a predetermined temperature or higher, the field device 2 according to the present embodiment is useful in that it can prevent operations from becoming unstable due to an excessively high temperature. The field device 2 according to the present embodiment is also useful if, for example, the main unit 200 itself generates a large amount of heat. In this case, the field device 2 can use this self-generated heat to maintain the temperature inside the case 300 after the start of power supply to the main unit 200, without using the heating element 500. In other words, if the main unit 200 itself generates a large amount of heat, and the temperature inside the case 300 becomes +50° C. or higher (for example, a temperature at which operations of the main unit 200 do not become unstable), then the second temperature switch 401 turns off, and power consumption in the main unit 200 can be suppressed. Like the first embodiment, the temperature switches may be joined in a heat transferable manner or adhered by resin potting.

Third Embodiment

Figure 6:
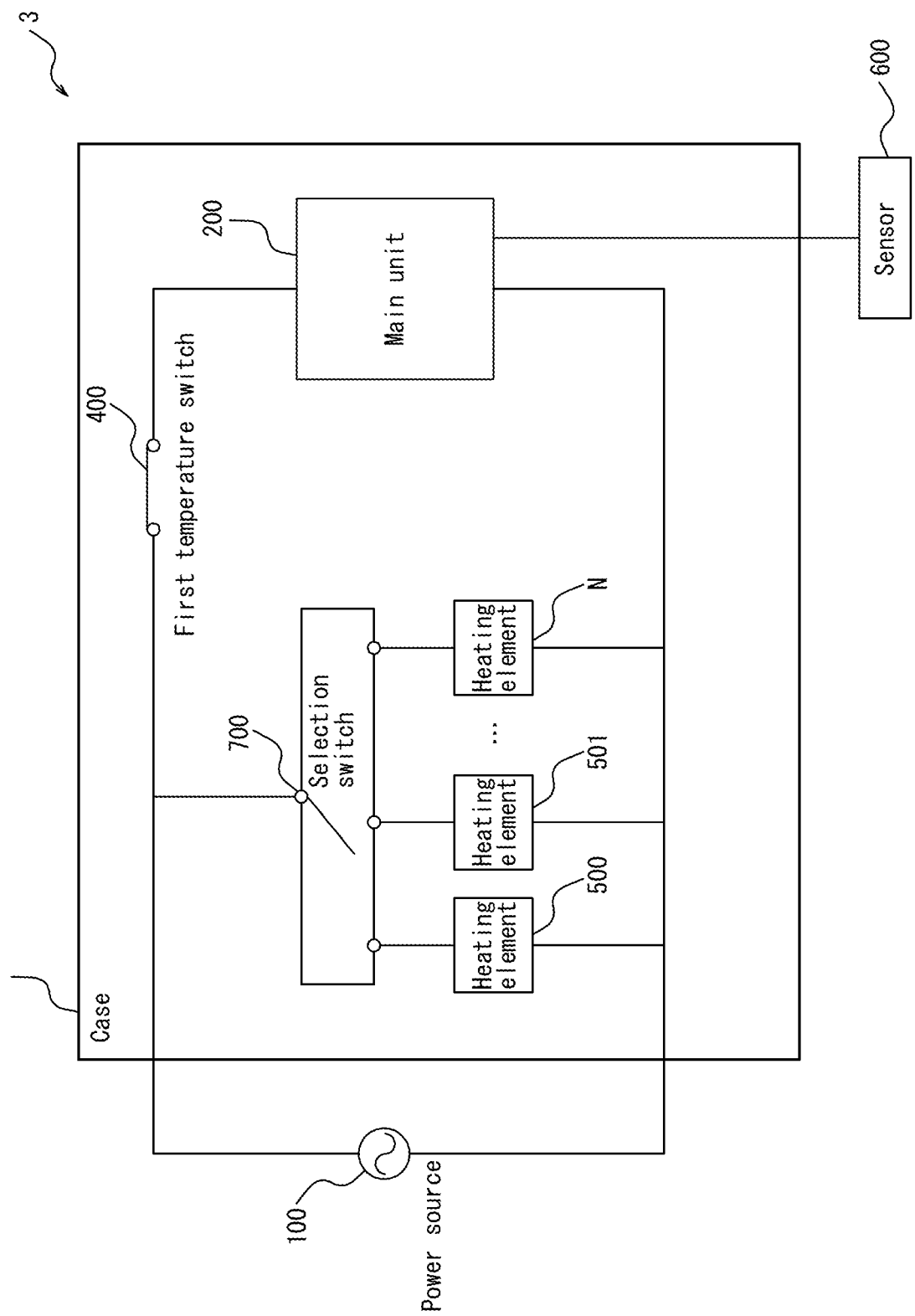
FIG. 6 is a functional block diagram illustrating the schematic configuration of a field device according to a third embodiment.

FIG. 6 is a functional block diagram illustrating the schematic configuration of a field device 3 according to a third embodiment. Like the field device 1 according to the first embodiment, the field device 3 according to the third embodiment includes a case 300, a main unit 200 housed inside the case 300, and a first temperature switch 400. Differences between the field device 3 according to the third embodiment and the field device 1 according to the first embodiment are focused on below, with a description of points in common being omitted as appropriate.

In addition to a heating element 500, the field device 3 according to the third embodiment includes at least one other heating element switchable with the heating element 500. FIG. 6 illustrates an example in which a plurality of other heating elements is provided. The field device 3 includes a selection switch 700. The selection switch 700 is housed inside the case 300.

The other heating elements 501, ..., N each receive a supply of power and generate heat. The other heating elements 501, ..., N have a different heat generation temperature gradient than the heating element 500. The other heating elements 501, ..., N may have different heat generation temperature gradients from each other.

The selection switch 700 is a switch capable of selectively switching the heating element connected to the power source 100 from among the plurality of heating elements 500, 501, ..., N. The selection switch 700 may, for example, be configured by a mechanical switch. Before an operation is inputted to turn on the power source 100 with respect to the field device 3, the user, manager, or the like of the field device 3, for example, inputs a switching operation to the selection switch 700 to connect one of the plurality of heating elements 500, 501, ..., N to the power source 100. When the power source 100 turns on with respect to the field device 3, power is supplied to the heating element, among the plurality of heating elements 500, 501, ..., N, that is connected to the power source 100 via the selection switch 700, and the connected heating element generates heat.

As described above, the plurality of heating elements 500, 501, ..., N have different heat generation temperature gradients. The user, manager, or the like can therefore switch the selection switch 700 to connect an appropriate heating element to the power source 100 for the use environment of the field device 3 or the like. For example, as the environmental temperature is lower, a heating element with a higher heat generation temperature gradient may be connected to the power source 100. In this way, the field device 3 according to the present embodiment can adjust the degree to which the temperature in the case 300 rises in accordance with the environmental temperature. This allows adjustment of the time until the temperature in the case 300 rises to the first temperature and the first temperature switch 400 turns on, i.e. the time from when power is inputted from the power source 100 to the field device 3 until the main unit 200 starts to operate. Like the first embodiment, the temperature switch may be joined in a heat transferable manner or adhered by resin potting.

The second and third embodiments may be combined. In other words, the field device 2 according to the second embodiment may be configured to include other heating elements besides the heating element 500 and to include the selection switch 700.

The present disclosure is not limited to the configurations specified in the above embodiments, and a variety of modifications may be made without departing from the scope of the claims. For example, the functions and the like included in the various components may be reordered in any logically consistent way. Furthermore, components may be combined into one or divided.

The invention claimed is:

1. A field device comprising:
   an electronic circuit connected to at least one of a sensor and an actuator;
   a bimetal temperature switch connected to a power source in series with the electronic circuit and configured to turn on when rising to a first temperature;
   a heating element connectable to the power source in parallel with the electronic circuit and the temperature switch; and
   a housing configured to house the electronic circuit, the temperature switch, and the heating element.

2. The field device of claim 1, wherein the temperature switch is joined in a heat transferable manner to a circuit board forming the electronic circuit.

3. The field device of claim 2, wherein the temperature switch is adhered to the circuit board by resin potting.

4. The field device of claim 1, further comprising another bimetal temperature switch connected to the power source in series with the heating element and in parallel with the electronic circuit and the temperature switch and configured to turn off when rising to a second temperature that is higher than the first temperature.

5. The field device of claim 1, further comprising another heating element that is switchable with the heating element and has a different heat generation temperature gradient than the heating element.

* * * * *